United States Patent
Otsuka et al.

(10) Patent No.: US 9,761,506 B2
(45) Date of Patent: Sep. 12, 2017

(54) SEMICONDUCTOR DEVICE AND FABRICATION METHOD FOR THE SAME

(75) Inventors: Takukazu Otsuka, Kyoto (JP); Bryon Western, West Park, AZ (US); Brandon Passmore, Fayetteville, AR (US); Zach Cole, Summers, AR (US)

(73) Assignees: ROHM CO., LTD., Kyoto (JP); CREE FAYETTEVILLE, INC., Fayetteville, AR (US)

( * ) Notice: Subject to any disclaimer, the term of this patent is extended or adjusted under 35 U.S.C. 154(b) by 42 days.

(21) Appl. No.: 13/403,341

(22) Filed: Feb. 23, 2012

(65) Prior Publication Data

US 2013/0221514 A1 Aug. 29, 2013

(51) Int. Cl.
*H01L 23/34* (2006.01)
*H01L 23/373* (2006.01)
(Continued)

(52) U.S. Cl.
CPC .......... *H01L 23/3735* (2013.01); *H01L 24/13* (2013.01); *H01L 24/16* (2013.01); *H01L 24/29* (2013.01); *H01L 24/33* (2013.01); *H01L 24/81* (2013.01); *H01L 24/83* (2013.01); *H01L 25/072* (2013.01); *H01L 24/32* (2013.01); *H01L 25/50* (2013.01); *H01L 2224/16245* (2013.01);
(Continued)

(58) Field of Classification Search
USPC .................. 257/712, 678; 438/615
See application file for complete search history.

(56) References Cited

U.S. PATENT DOCUMENTS 5,421,507 A * 6/1995 Davis et al. .................. 228/194
7,847,411 B2 * 12/2010 Takaike ............ H01L 23/49827
257/686

(Continued)

FOREIGN PATENT DOCUMENTS

JP 04-503480 A 6/1992
JP H09237868 A 9/1997
(Continued)

OTHER PUBLICATIONS

Warren C. Welch, III et al., "Transfer of Metal MEMS Packages Using a Wafer-Level Solder Transfer Technique", IEE Transactions on Advanced Packaging, vol. 28, No. 4, Nov. 2005, pp. 643-649.

(Continued)

*Primary Examiner* — Telly Green
(74) *Attorney, Agent, or Firm* — Cantor Colburn LLP

(57) ABSTRACT

Provided is a double-sided cooling structure for a semiconductor device using a low processing temperature and reduced processing time utilizing solid phase diffusion bonding. The fabrication method for this system is provided. The semiconductor device 1 comprising: a mounting substrate 70; a semiconductor chip 10 disposed on the mounting substrate 70 and a semiconductor substrate 26, a source pad electrode SP and a gate pad electrode GP disposed on a surface of the semiconductor substrate 26, and a drain pad electrode 36 disposed on a back side surface of the semiconductor substrate 26 to be contacted with the mounting substrate 70; and a source connector SC disposed on the source pad electrode SP. The mounting substrate 70 and the drain pad electrode 36 are bonded by using solid phase diffusion bonding.

19 Claims, 14 Drawing Sheets

(51) Int. Cl.
*H01L 23/00* (2006.01)
*H01L 25/07* (2006.01)
*H01L 25/00* (2006.01)

(52) U.S. Cl.
CPC ........... *H01L 2224/32225* (2013.01); *H01L 2224/32245* (2013.01); *H01L 2224/73253* (2013.01); *H01L 2224/8182* (2013.01); *H01L 2224/8383* (2013.01); *H01L 2924/1033* (2013.01); *H01L 2924/10272* (2013.01); *H01L 2924/1305* (2013.01); *H01L 2924/13055* (2013.01); *H01L 2924/13091* (2013.01); *H01L 2924/1461* (2013.01); *H01L 2924/351* (2013.01)

(56) References Cited

U.S. PATENT DOCUMENTS

2006/0151871 A1    7/2006  Mehrotra
2009/0290315 A1*  11/2009  Iwamiya ............. H05K 1/0216
                                                                 361/758
2011/0254177 A1*  10/2011  Malhan ............ H01L 23/49844
                                                                 257/782
2013/0092948 A1*   4/2013  Otsuka ............ H01L 23/49827
                                                                 257/76

FOREIGN PATENT DOCUMENTS

| JP | 2001110823 A | 4/2001 |
| JP | 2003082383 A | 3/2003 |
| JP | 2003092383 A | 3/2003 |
| JP | 2006500774 A | 1/2006 |
| JP | 2008060529 A | 8/2008 |
| JP | 2010-245329 A | 10/2010 |
| WO | 90/09255 A1 | 8/1990 |
| WO | 2006/074165 A2 | 7/2006 |

OTHER PUBLICATIONS

Japanese Notification of Reasons for Refusal corresponding to Application No. 2012-093101; Date of Mailing: Mar. 15, 2016, with English translation.

* cited by examiner

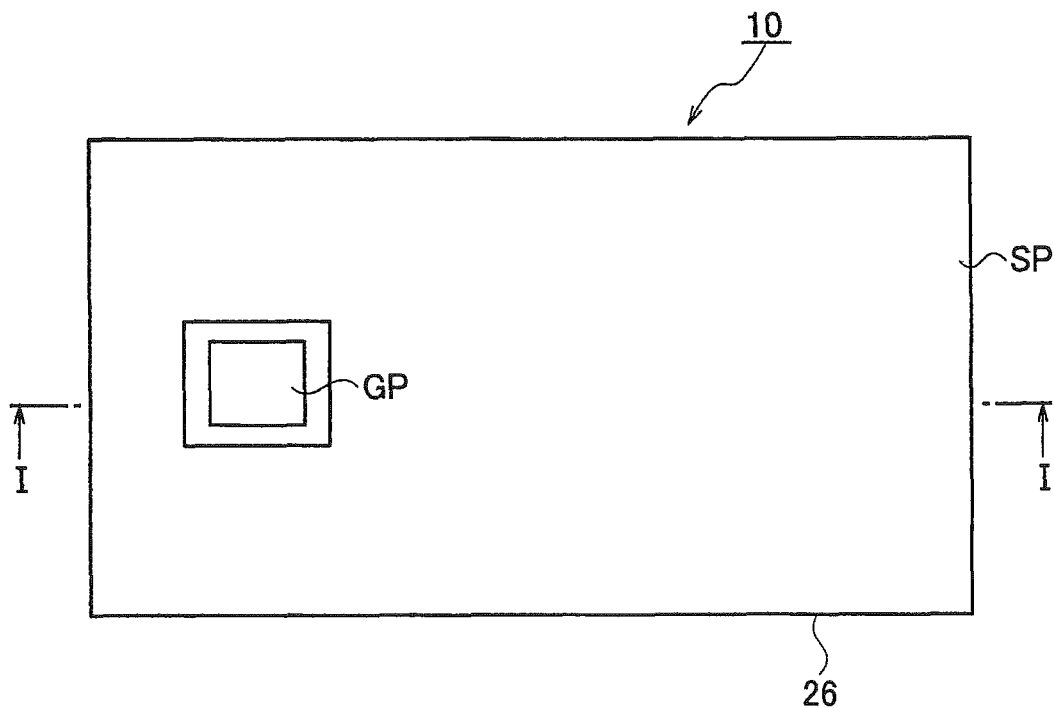
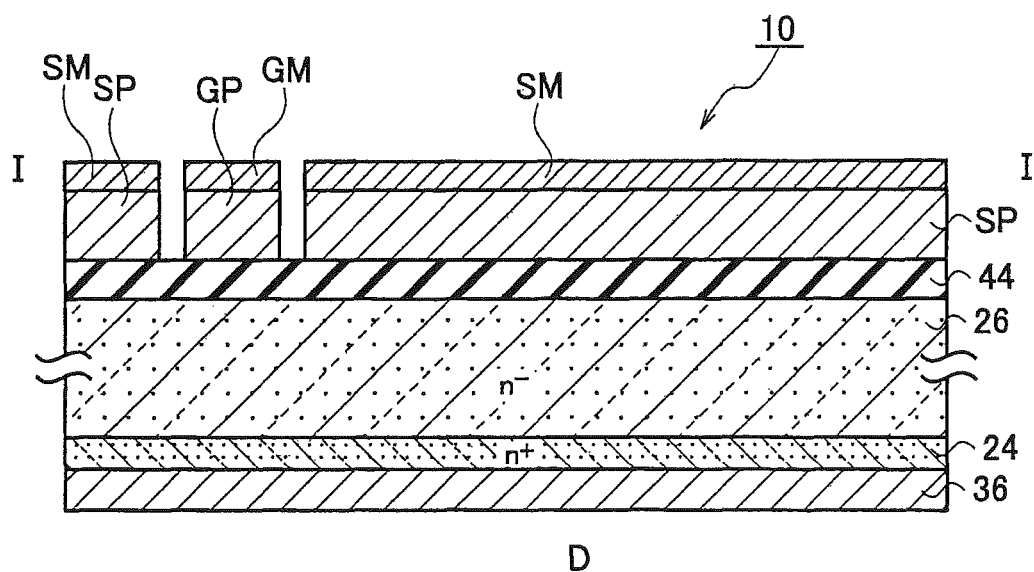

SEMICONDUCTOR DEVICE AND FABRICATION METHOD FOR THE SAME

TECHNICAL FIELD

The present invention relates to a semiconductor device and a fabrication method for such semiconductor device. In particular, the present invention relates to a semiconductor device having a double-sided cooling structure by solid phase diffusion bonding, and a fabrication method for such semiconductor device.

BACKGROUND ART

Many research institutions are currently conducting research to develop Silicon Carbide (SiC) devices. Advantages of SiC power devices over traditional silicon devices include low on resistance, high switching speed, high temperature operation, etc.

Conventional silicon power devices, such as Insulated Gate Bipolar Transistors (IGBTs), are limited to about 150 degrees C. maximum operating temperature. Therefore, it is possible to employ Si devices even when using low melting point solder, such as a conventional Sn—Ag alloy based solder.

However, SiC based devices can theoretically operate to temperatures of 600 degrees C. If the SiC devices are employed at a high temperature when using conventional low melting point solder, they will lose their mechanical attachment to the circuit board due to the solder melting.

High temperature solders are currently being used to attach SiC, but they also present several problems. Manufacturing void free solder bonds is a labor intensive process that does not easily lend itself to mass production. The high processing temperatures necessary to employ high temperature solder joints can create thermal stress in the bond due to mismatches in thermal expansion between the substrate, solder, and SiC device. These thermal stresses can lead to premature failure of the circuits. Additionally, any material added between the device and the substrate increases the thermal resistance. For power devices that self-heat during operation, this can degrade the performance of the entire system.

Methods for creating an interconnect between the SiC devices and a low thermal resistance package have already been disclosed (for example, refer to Patent Literature 1 and Patent Literature 2). Patent Literature 1 and Patent Literature 2 disclose a fabrication method of a package used for housing a SiC device, and also disclose that the SiC device is bonded to other parts or conductive surfaces using Transient Liquid Phase (TLP) bonding technology.

Another disclosure details a solder compound whose melting point is comparatively low (e.g., the melting point is not more than 430 degrees C.) including Sn and/or Pb (for example, refer to Patent Literature 3). In Patent Literature 3, the solder alloy has a difference in temperature between the liquid phase and the solid phase smaller than that of the basic solder.

Another relevant disclosure details the transfer of metal MEMS packages using a wafer-level solder transfer technology (for example, refer to Non Patent Literature 1). In Non Patent Literature 1, a device wafer and a package cap are bonded by the TLP technology using relatively thin Ni—Sn layer.

A liquid cooling device for removing heat from a semiconductor element via a cooling device from the back side surface of the semiconductor element has been disclosed (for example, refer to Patent Literature 4).

CITATION LIST

Patent Literature 1: International publication No. WO 2006/074165
Patent Literature 2: United States Patent Application Publication No. 2006/0151871
Patent Literature 3: Japanese Patent Application Laying-Open Publication (Translation of PCT Application) No. H04-503480
Patent Literature 4: Japanese Patent Application Laying-Open Publication No. 2010-245329
Non Patent Literature 1: Warren C. Welch, III, Junseok Chae, and Khalil Najafi, "Transfer of Metal MEMS Packages Using a Wafer-Level Solder Transfer Technique", IEEE TRANSACTION ON ADVANCED PACKAGING, VOL. 28, NO. 4, November 2005, pp. 643-649

SUMMARY OF THE INVENTION

Technical Problem

Currently, in order to satisfy a Pb-free request, Sn—Ag based solder etc. which are low melting point solder are generally used. However, as stated above, the low melting point solder cannot be used for a device that operates at a high temperature, such as SiC, since the melting temperatures of the solders are low (e.g., about 230 degrees C. at the maximum).

The objective of the present invention is to provide a double-sided cooling structure for a semiconductor device using low processing temperature and reduced processing time by utilizing solid phase diffusion bonding, and also providing a fabrication method for such a system.

Solution to Problem

According to an aspect of the present invention, provided is a semiconductor device including: a mounting substrate; a semiconductor chip disposed on the mounting substrate and comprising a semiconductor substrate, a source pad electrode and a gate pad electrode on a surface of the semiconductor substrate, and a drain pad electrode on a back side surface of the semiconductor substrate to be contacted with the mounting substrate; and a source connector disposed on the source pad electrode, wherein the mounting substrate and the drain pad electrode are bonded by using solid phase diffusion bonding.

According to another aspect of the present invention, provided is a fabrication method for a semiconductor device, the semiconductor device including: a mounting substrate; a semiconductor chip located on the mounting substrate and which is comprised of a semiconductor substrate, a source pad electrode and a gate pad electrode located on a surface of the semiconductor substrate, and a drain pad electrode located on a back side surface of the semiconductor substrate to be contacted with the mounting substrate; and a source connector on the source pad electrode, the method including: forming a drain solid phase diffusion bonding layer by bonding the mounting substrate and the drain pad electrode using solid phase diffusion bonding; and forming a source solid phase diffusion bonding layer by bonding the source pad electrode and the source connector using solid phase diffusion bonding.

Advantageous Effects of Invention

According to the present invention, it can provide a double-sided cooling mechanism for a semiconductor device using low processing temperature and reduced processing time by utilizing the solid phase diffusion bonding, and the fabrication method for such a system.

BRIEF DESCRIPTION OF DRAWINGS

FIG. 1 is a schematic planar pattern configuration diagram showing a semiconductor chip mounted in a semiconductor device according to an embodiment.

FIG. 2 is a schematic cross-sectional configuration diagram taken in the line I-I of FIG. 1.

DESCRIPTION OF EMBODIMENTS

Figure 3:
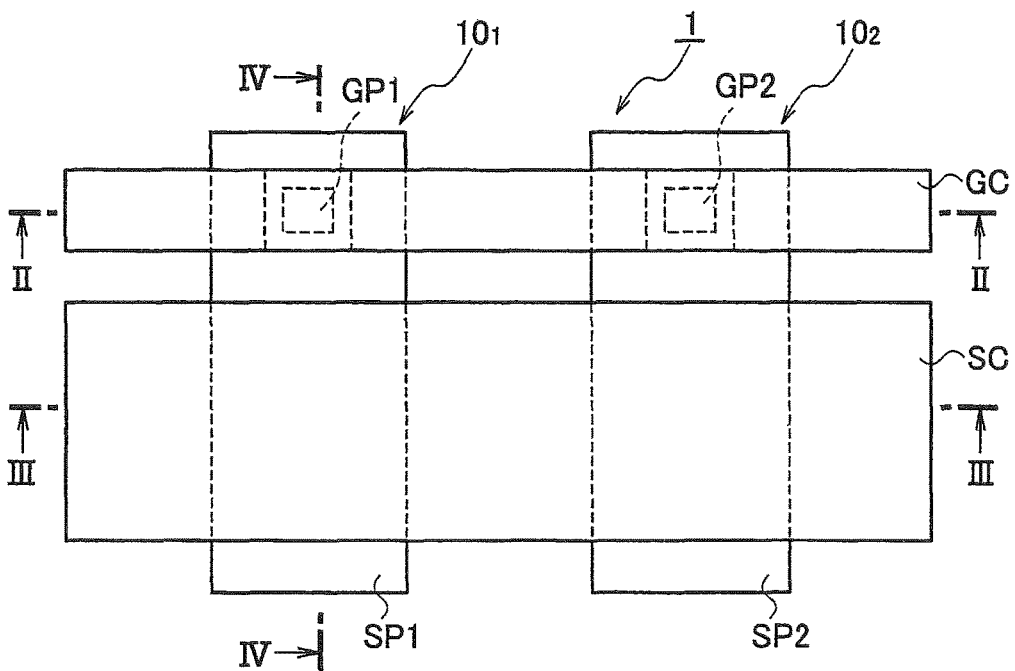
FIG. 3 is a schematic planar pattern configuration diagram showing the semiconductor device according to the embodiment including a plurality of the semiconductor chips shown in FIG. 1 disposed in parallel.

Next, embodiments of the invention will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from the actual, scaled dimensions. Therefore, detailed thickness and size should be taken into consideration. Thus, the relation and ratio of the size difference is included in drawings.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

Embodiment

FIG. 1 shows a schematic planar pattern configuration of a semiconductor chip (e.g., a power transistor) 10 mounted in a semiconductor device 1 according to the embodiment. FIG. 2 shows a schematic cross-sectional configuration taken in the line I-I of FIG. 1.

As shown in FIG. 1 to FIG. 2, the semiconductor chip 10 mounted in the semiconductor device 1 according to the embodiment includes: a semiconductor substrate 26; a source pad electrode SP and a gate pad electrode GP disposed on an interlayer insulating film 44 formed on a surface of the semiconductor substrate 26; and a drain pad electrode 36 disposed on a drain region 24 formed on a back side surface of the semiconductor substrate 26. A detailed structure of the semiconductor chip 10 will be specified later in full detail in FIG. 7 to FIG. 8. Therefore, illustration of the detailed structure is omitted in FIG. 2.

In FIG. 1, silver (Ag), gold (Au), titanium (Ti), nickel (Ni), etc. may be formed on a surface of the source pad electrode SP and a surface of the gate pad electrode GP. That is, as shown in FIG. 2, a metal layer SM-GM composed of Ag, Au, Ti, Ni, etc. may be formed on a surface of the semiconductor chip 10 (i.e., on the surface of the source pad electrode SP and the surface of the gate pad electrode GP) by using plating technology, sputtering technology, or vacuum evaporation technology.

Figure 4:
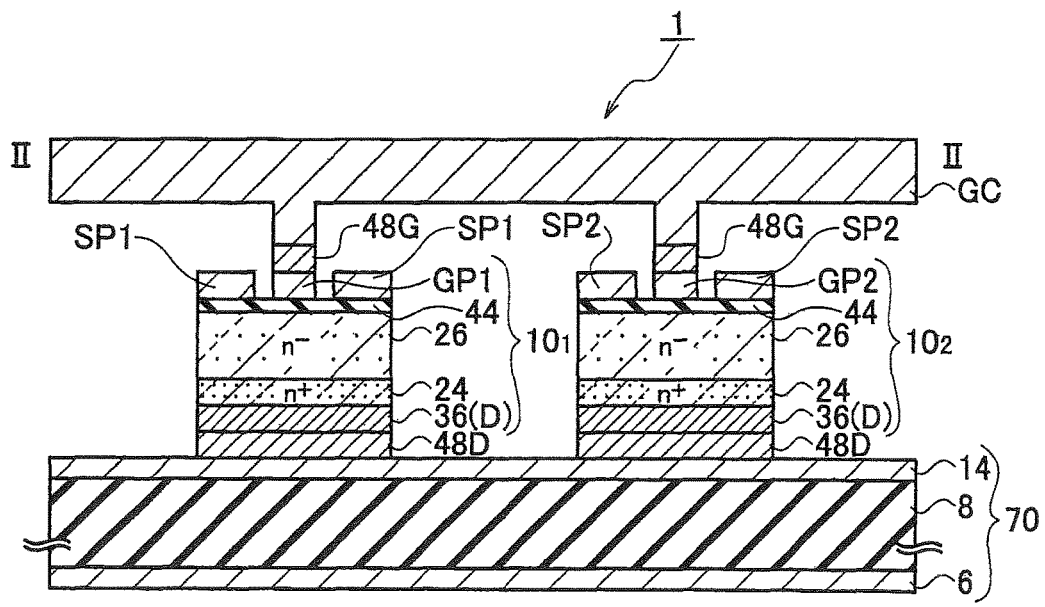
FIG. 4 is a schematic cross-sectional configuration diagram taken in the line II-II of FIG. 3.
Figure 5:
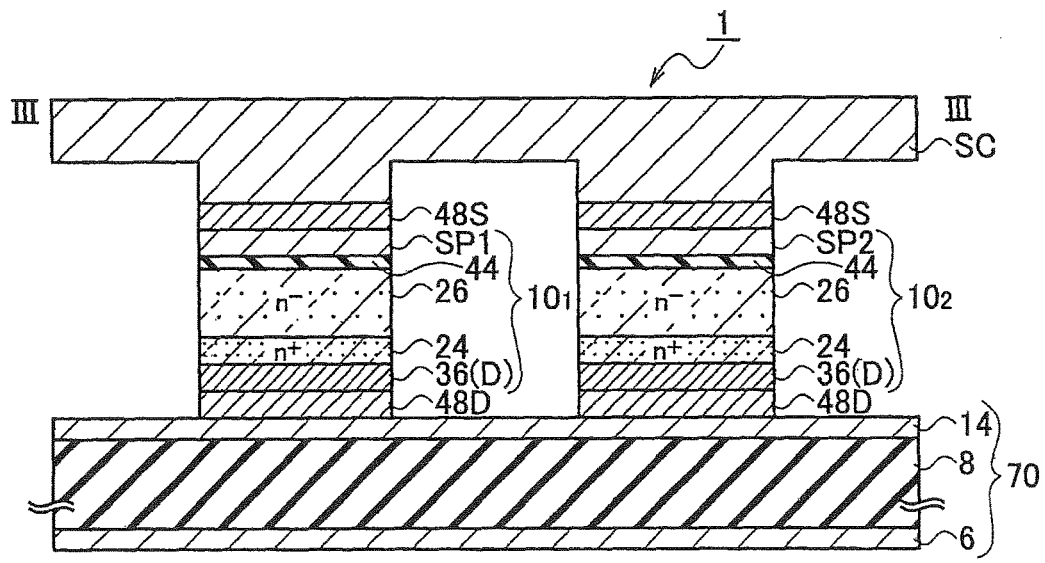
FIG. 5 is a schematic cross-sectional configuration diagram taken in the line of FIG. 3.
Figure 6:
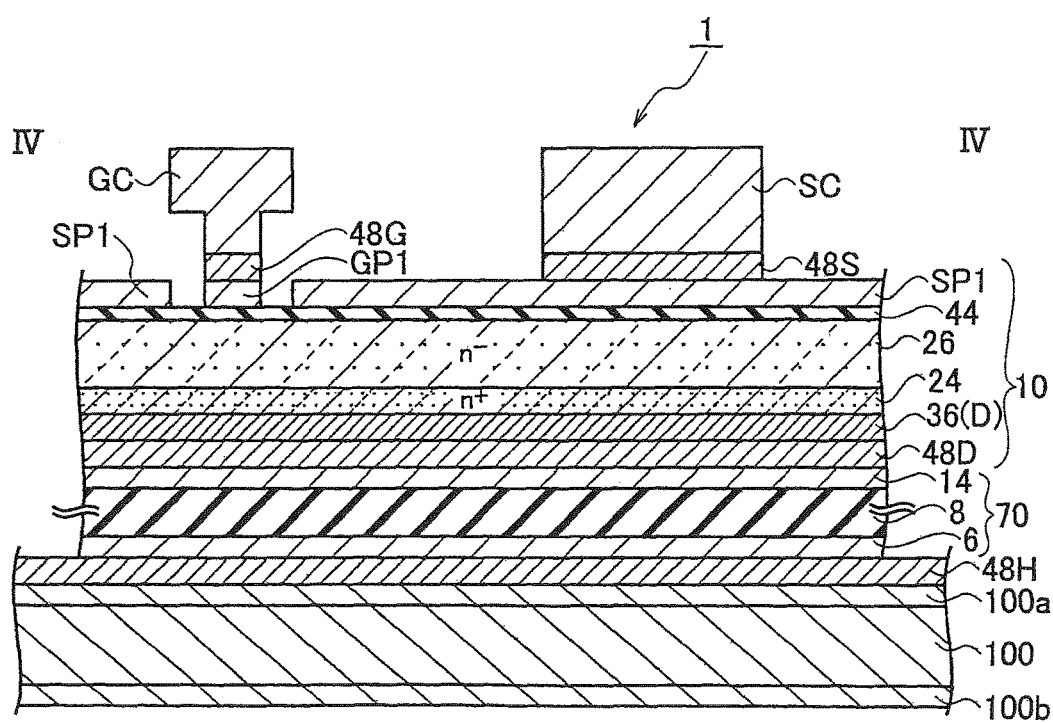
FIG. 6 is a schematic cross-sectional configuration diagram taken in the line IV-IV of FIG. 3, and is a schematic cross-sectional configuration diagram showing the semiconductor device mounted on a heat spreader.

FIG. 3 is a schematic planar pattern configuration diagram showing the semiconductor device 1 according to the embodiment including a plurality of the semiconductor chips 10 shown in FIG. 1 disposed in parallel. FIG. 4 shows a schematic cross-sectional structure taken in the line II-II of FIG. 3. FIG. 5 shows a schematic cross-sectional configuration taken in the line III-III line of FIG. 3. Also, FIG. 6 is a schematic cross-sectional configuration diagram taken in the line IV-IV of FIG. 3, and is a schematic cross-sectional configuration diagram showing the semiconductor device 1 mounted on a heat spreader 100. In this case, although the configuration example of the plurality of the semiconductor chips 10 disposed in parallel is disclosed, only one semiconductor chip 10 may be disposed.

As shown in FIG. 1 to FIG. 5, the semiconductor device 1 according to the embodiment includes: a mounting substrate 70; semiconductor chips $10_1$ and $10_2$ disposed on the mounting substrate 70, the respective semiconductor chips $10_1$ and $10_2$ having a semiconductor substrate 26, source pad electrodes SP1 and SP2 and gate pad electrodes GP1 and GP2 disposed on a surface of the semiconductor substrate 26, and a drain pad electrode 36 disposed in contact with the mounting substrate 70 on a back side surface of the semiconductor substrate 26; and a source connector SC disposed on the source pad electrodes SP1 and SP2. The mounting substrate 70 and the drain pad electrode 36 are bonded by using solid phase diffusion bonding.

As shown in FIG. 6, the semiconductor device 1 according to the embodiment may further include a heat spreader 100 for mounting the mounting substrate 70. In this case, the mounting substrate 70 and the heat spreader 100 are also bonded by using the solid phase diffusion bonding.

As shown in FIG. 3 and FIG. 5, the source pad electrodes SP1 and SP2 and the source connector SC are also bonded by using the solid phase diffusion bonding.

As shown in FIG. 3 and FIG. 4, the semiconductor device 1 according to the embodiment may further include a gate connector GC disposed on the gate pad electrodes GP1 and GP2. In this case, the gate pad electrodes GP1 and GP2 and the gate connector GC are bonded by using the solid phase diffusion bonding.

As shown in FIG. 3 and FIG. 5 to FIG. 6, the semiconductor device 1 according to the embodiment may also include a plurality of the semiconductor chips $10_1$ and $10_2$. The source connector SC may be simultaneously bonded to the respective source pad electrodes SP1 and SP2 of the semiconductor chips $10_1$ and $10_2$ by using the solid phase diffusion bonding.

Similarly, as shown in FIG. 3 to FIG. 4 and FIG. 6, in the semiconductor device 1 according to the embodiment, the gate connector GC may be simultaneously bonded to the respective gate pad electrodes GP1 and GP2 of the semiconductor chips $10_1$ and $10_2$ by using the solid phase diffusion bonding.

As shown in FIG. 4 to FIG. 6, in the semiconductor device 1 according to the embodiment, the mounting substrate 70 may include an insulating substrate 8 and a metal layer 14 disposed on a surface of the insulating substrate 8. A drain solid phase diffusion bonding layer 48D between the metal layer 14 and the drain pad electrode 36 may be also provided between the mounting substrate 70 and the drain pad electrode 36.

As shown in FIG. 5 to FIG. 6, the semiconductor device 1 according to the embodiment may also include a source solid phase diffusion bonding layer 48S formed between the source pad electrodes SP1 and SP2 and the source connector SC by using the solid phase diffusion bonding.

As shown in FIG. 4 and FIG. 6, the semiconductor device 1 according to the embodiment may also include a gate solid phase diffusion bonding layer 48G formed between the gate pad electrodes GP1 and GP2 and the gate connector GC by using the solid phase diffusion bonding.

As shown in FIG. 6, in the semiconductor device 1 according to the embodiment, the mounting substrate 70 may include the insulating substrate 8 and a metal layer 6 disposed on a back side surface of the insulating substrate 8, and a heat spreader solid phase diffusion bonding layer 48H formed by using the solid phase diffusion bonding may be also provided between the mounting substrate 70 and the heat spreader 100.

The gate solid phase diffusion bonding layer 48G, the source solid phase diffusion bonding layer 48S, the drain solid phase diffusion bonding layer 48D, and the heat spreader solid phase diffusion bonding layer 48H can be formed by bonding one or more kinds of metals selected from the group consisting of Ag, Au, Ti and Ni, using the solid phase diffusion bonding process. In this case, one or more kinds of metals selected from the group consisting of Ag, Au, Ti and Ni can be formed by using plating technology, sputtering technology, or vacuum evaporation technology.

The source connector SC and the gate connector GC can be formed with one material selected from the group consisting of aluminum (Al), copper (Cu), a copper molybdenum (CuMo) alloy, a copper tungsten (CuW) alloy, and Al—SiC.

When forming the solid phase diffusion bonding layers 48G, 48S, 48D and 48H in the semiconductor device 1 according to the embodiment, it is preferable that: a value of the pressure applied to the respective bonding parts is not less than about 1 MPa but not more than about 100 MPa; and the heating processing temperature is not less than about 200 degrees C. but not more than about 350 degrees C.

(Fabrication Method for Semiconductor Device)

As shown in FIG. 5, a fabrication method for the semiconductor device 1 according to the embodiment includes: forming the drain solid phase diffusion bonding layer 48D by bonding the mounting substrate 70 and the drain pad electrode 36 using the solid phase diffusion bonding; and forming the source solid phase diffusion bonding layer 48S by bonding the source connector SC and the source pad electrodes SP1 and SP2 using the solid phase diffusion bonding.

In the fabrication method of the semiconductor device 1 according to the embodiment, the step of forming the drain solid phase diffusion bonding layer 48D and the step of forming the source solid phase diffusion bonding layer 48S may be performed simultaneously.

As shown in FIG. 6, the fabrication method for the semiconductor device 1 according to the embodiment may further include forming the heat spreader solid phase diffusion bonding layer 48H by bonding the mounting substrate 70 and the heat spreader 100 for mounting the mounting substrate 70 using the solid phase diffusion bonding.

As shown in FIG. 4, the fabrication method for the semiconductor device 1 according to the embodiment may further include forming the gate solid phase diffusion bonding layer 48G by bonding the gate pad electrodes GP1 and GP2 and the gate connector GC disposed on the gate pad electrodes GP1 and GP2 using the solid phase diffusion bonding.

In the fabrication method of the semiconductor device 1 according to the embodiment, a value of the pressure required for forming the solid phase diffusion bonding is not less than about 1 MPa but not more than about 100 MPa, for example; and the heating processing temperature required for forming the solid phase diffusion bonding is not less than about 200 degrees C. but not more than about 350 degrees C., for example.

(Drain Solid Phase Diffusion Bonding)

Ag, Au, Ti, Ni, etc. are formed on the drain side of the semiconductor chip 10 by using plating technology, sputtering technology, or vacuum evaporation technology. For example, a structure of the drain pad electrode 36 in which Ti/Ni/Au/Ag are laminated one after another on the drain region 24 may be formed. Also, when forming the source electrode 34 of the semiconductor chip 10 with Al, an electrode structure in which Ni/Ag are laminated one after another may be formed on the above-mentioned Al.

Ag, Au, Ti, Ni, etc. are formed on the insulating substrate 8 by using the plating technology, the sputtering technology, or the vacuum evaporation technology in order to form the mounting substrate 70.

Ti/Ni/Au/Ag formed on the back side surface of the semiconductor chip 10 are then contacted with Ag, Au, Ti, etc. formed on the insulating substrate 8. Fundamentally, the bonding is possible in any combination of the above-mentioned metals. Although bonding materials (e.g., solder) are not required for bonding, when the surfaces (e.g., the surface of the insulating substrate 8) are rough, the interlayer metals 12a and 12b composed of solder (e.g., Ag) and/or the above-mentioned metal(s) may be disposed between the back side surface of the semiconductor chip 10 and the insulating substrate 8 in order to enhance the contact between the surfaces.

Under such state, the pressure is applied from both of the upper part of the semiconductor chip 10 and the lower part of the insulating substrate 8. The value of the pressure is set to not less than about 1 MPa but not more than about 100 MPa, for example. The reason for applying the pressure is for enhancing the contact between the back side surface of the semiconductor chip 10 and the surface of the insulating substrate 8. Plastic deformation occurs on the respective surfaces by increasing the applied the pressure during the process of making the contact, and thereby the contact surfaces will change the interface. At the time of the process, heat as well as the pressure is also added. The heating processing temperature is set to about 200 degrees C. to about 350 degrees C. During the heating process, atomic diffusion creates in the newly formed interface at the bonded surface, thereby forming a clear bonded surface.

The holding time period of the heating processing temperature (about 200 degrees C. to about 350 degrees C.) is approximately 20 minutes. In addition, the total cooling time period (heating processing temperature to room temperature) is approximately 20 minutes, whereas the heating time period from normal temperature to heating processing temperature is approximately 40 minutes. Therefore, the total process time period is within about 1 hour.

(Heat Spreader Solid Phase Diffusion Bonding)

Bonding between the insulating substrate 8 and a base plate (e.g., the heat spreader 100) can be formed similarly. That is, the metal layers 100a and 100b composed of Ag, Au, Ti, Ni, etc. are formed on the surface of the heat spreader 100 using the plating technology, the sputtering technology, or the vacuum evaporation technology. On the other hand, the metal layers 14 and 6 composed of Ag, Au, Ti, Ni, etc. are also formed on the surface of the insulating substrate 8 using the plating technology, the sputtering technology, or the vacuum evaporation technology.

Next, the back side surface of the insulating substrate 8 and the surface of the heat spreader 100 are contacted, and pressure and heat are applied in the same manner as mentioned above, thereby forming the heat spreader solid phase diffusion bonding layer 48H.

Next, the surface of the drain pad electrode 36 of the semiconductor chip 10 and the surface of the mounting substrate 70 may be contacted, pressure and heat may be applied in the same manner as mentioned above, and thereby the drain solid phase diffusion bonding layer 48D may be formed as well.

Next, in a surface side of the semiconductor chip 10, the source solid phase diffusion bonding layer 48S may be formed between the source connector SC and the source pad electrode SP, and the gate solid phase diffusion bonding layer 48G may be also formed between the gate pad electrode GP and the gate connector GC.

The order of forming the solid phase diffusion bonding layer is not limited in the above-mentioned order (i.e., the heat spreader solid phase diffusion bonding layer 48H—the drain solid phase diffusion bonding layer 48D—the source solid phase diffusion bonding layer 48S—the gate solid phase diffusion bonding layer 48G), but suitable order can be selected. For example, firstly the drain solid phase diffusion bonding layer 48D, the source solid phase diffusion bonding layer 48S and the gate solid phase diffusion bonding layer 48G may be formed by simultaneous processes, and, finally the heat spreader solid phase diffusion bonding layer 48H may be formed.

(Source Solid Phase Diffusion Bonding and Gate Solid Phase Diffusion Bonding)

As shown in FIG. 3 to FIG. 6, in the fabrication method for the semiconductor device 1 according to the embodiment, first of all, source connector SC and the gate connector GC for being bonded to the source pad electrode SP and the gate pad electrode GP are prepared. Materials having high electrical conductivity and high thermal conductivity are fundamentally selected, and materials having a coefficient of thermal expansion near that of the semiconductor chip 10 to be mounted are also selected, as materials of the source connector SC and the gate connector GC. For example, it is selectable from materials (e.g., Al and Cu), as the materials having high electrical conductivity and high thermal conductivity. Alternatively, it is selectable from materials, such as, CuMo, CuW, Al—SiC, from the viewpoint of the materials having a coefficient of thermal expansion near that of the semiconductor chip 10 to be mounted. Ag, Au, Ti, Ni, etc. may be formed on a surface of the materials of the source connector SC and gate connector GC using the plating technology, the sputtering technology, or the vacuum evaporation technology. In addition, the source connector SC and the gate connector GC can be also bonded simultaneously to a plurality of the semiconductor chips 10.

Next, as shown in FIG. 2, metal layers SM and GM composed of Ag, Au, Ti, Ni, etc. are formed on the surface of the semiconductor chip 10 (i.e., on the source pad electrode SP and the gate pad electrode GP) using plating technology, sputtering technology, or vacuum evaporation technology.

Materials of the metal layers SM and GM can be changed depending on the materials of the source connector SC and the gate connector GC to be bonded thereto. For example, when the source connector SC and the gate connector GC are covered with a Ag plating layer, it is also possible to form the metal layers SM and GM composed of Ag using plating technology, sputtering technology, or vacuum evaporation technology on the source pad electrode SP and the gate pad electrode GP of the semiconductor chip 10, thereby forming the solid phase diffusion bonding between Ag—Ag easily.

On the other hand, when the source pad electrode SP and the gate pad electrode GP of the semiconductor chip 10 are formed with Al, it is effective to apply Ni plating onto the source connector SC and the gate connector GC, in order to inhibit oxidation of Al. Since Al is an extremely soft metal, plastic deformation occurs easily under the solid phase diffusion bonding process. However, a state in a minimum amount of an oxide film is achieved by applying the Ni plating onto the source connector SC and the gate connector GC, and thereby the solid phase diffusion bonding can be formed easily.

A configuration of the semiconductor device 1 according to the embodiment after the fabricating process thereof is represented as shown in FIG. 3 to FIG. 6.

As shown in FIG. 4, the drain solid phase diffusion bonding layer 48D is formed between the drain pad electrode 36 and the insulating substrate 8 of the semiconductor chip 10, and the gate solid phase diffusion bonding layer 48G is also formed between the gate connector GC and the gate pad electrodes GP1 and GP2 of the semiconductor chip 10.

Similarly, as shown in FIG. 5, the drain solid phase diffusion bonding layer 48D is formed between the drain pad electrode 36 and the insulating substrate 8 of the semiconductor chip 10, and the source solid phase diffusion bonding layer 48S is also formed between the source connector SC and the source pad electrodes SP1 and SP2 of the semiconductor chip 10.

In the fabrication method for the semiconductor device 1 according to the embodiment, the surface of the drain pad electrode 36 is formed of Ag and the Ag plating is applied on the surface of the mounting substrate 70, for example, by using the drain solid phase diffusion bonding process between the drain pad electrode 36 and the mounting substrate 70 of the semiconductor chip 10, and thereby the solid phase diffusion bonding layer 48D is formed by Ag—Ag bonding. A melting temperature of the solid phase diffusion bonding layer 48D is also about 960 degrees C. which is a melting point of Ag.

According to the semiconductor device 1 according to the embodiment, the solid phase diffusion bonding layers 48D, 48S, 48H and 48G having the high melting point can be obtained by the heating process at relatively low temperatures (about 200 degrees C. to about 350 degrees C.).

Furthermore, according to semiconductor device 1 and the embodiment, the source pad electrode SP and the gate pad electrode GP is bonded, respectively, to the source connector SC and the gate connector GC by using the solid phase diffusion bonding, and the drain pad electrode 36 is bonded to the mounting substrate 70 by using the solid phase diffusion bonding, thereby achieving a wirebondless interconnection scheme and double-sided cooling method for the semiconductor chip 10.

The double-sided cooling performance of the semiconductor chip 10 can be further enhanced by bonding the mounting substrate 70 to the heat spreader 100 using the aforementioned solid phase diffusion bonding process.

(Configuration Example of Semiconductor Chip)

Figure 7:
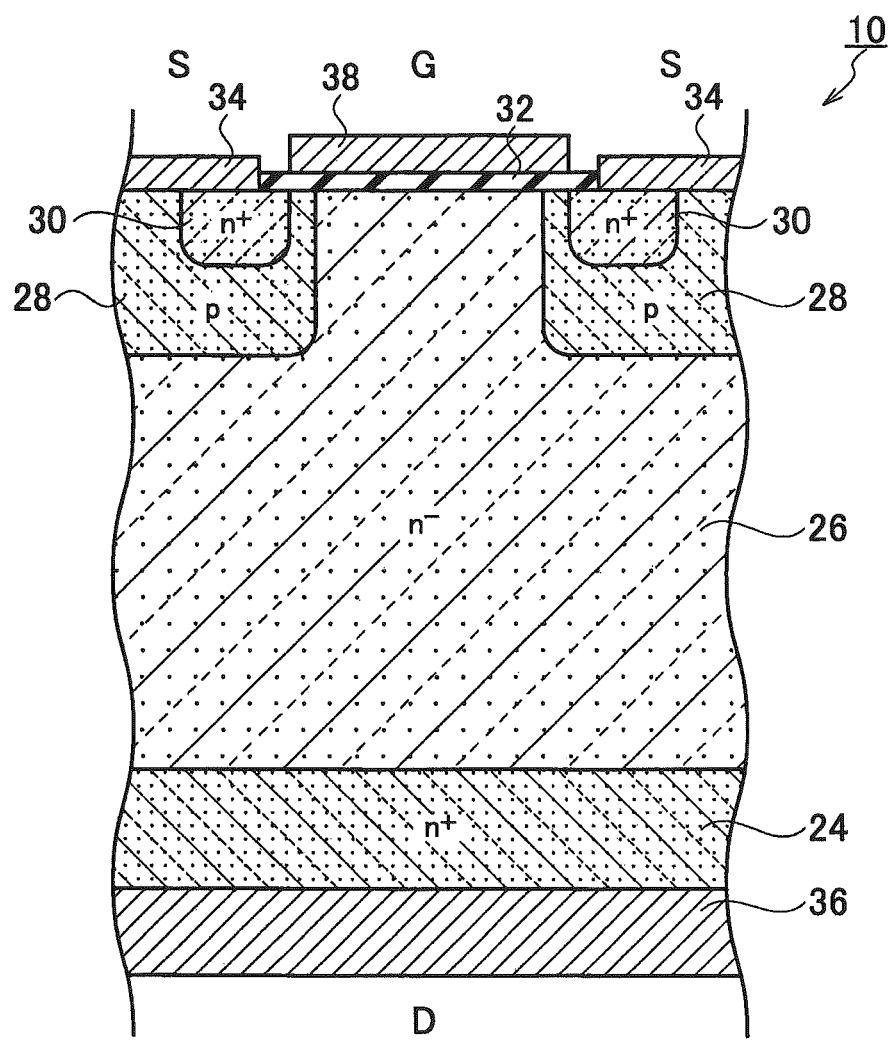
FIG. 7 shows an example of the semiconductor chip applying to the semiconductor device according to the embodiment, and is a schematic cross-sectional configuration diagram showing SiC-MOSFET.

As shown in FIG. 7, as an example of the semiconductor chip 10 applied to the semiconductor device 1 according to the embodiment, a schematic cross-sectional structure of the SiC-MOSFET includes: a semiconductor substrate 26 composed of an n-type high resistivity layer; P type base regions 28 formed in a surface side of the semiconductor substrate 26; source regions 30 formed in the surface of the p type base regions 28; a gate insulating film 32 disposed on the surface of the semiconductor substrate 26 between the p type base regions 28; a gate electrode 38 disposed on the gate insulating film 32; source electrodes 34 connected to the source regions 30; a n+ type drain region 24 disposed on a back side opposite to the surface of the semiconductor substrate 26; and a drain pad electrode 36 connected to the n+ type drain region 24.

In FIG. 7, although the semiconductor chip 10 is composed of a planar-gate-type n channel vertical SiC-MOSFET, the semiconductor chip 10 may be composed of a trench-gate-type n channel vertical SiC-MOSFET etc.

A GaN based FET etc. instead of the SiC-MOSFET are also applicable to the semiconductor chip 10 applied to the semiconductor device 1 according to the embodiment.

One of an SiC based power device, a GaN based power device or an AlN based power device is applicable to the semiconductor chip 10 applied to the semiconductor device 1 according to the embodiment.

A semiconductor whose bandgap energy is 1.1 eV to 8 eV, for example, can be also used for the semiconductor chip 10 applied to the semiconductor device 1 according to the embodiment.

According to the semiconductor device 1 and according to the embodiment, since the solid phase diffusion bonding layers 48G, 48S, 48D and 48H have high heat resistance (e.g., the melting point of metallic silver reaches to about 960 degrees C.), the power device (e.g., SiC based FET and a GaN based FET) can be driven at high temperature by applying the solid phase diffusion bonding layers 48G, 48S, 48D and 48H to the power device.

Figure 8:
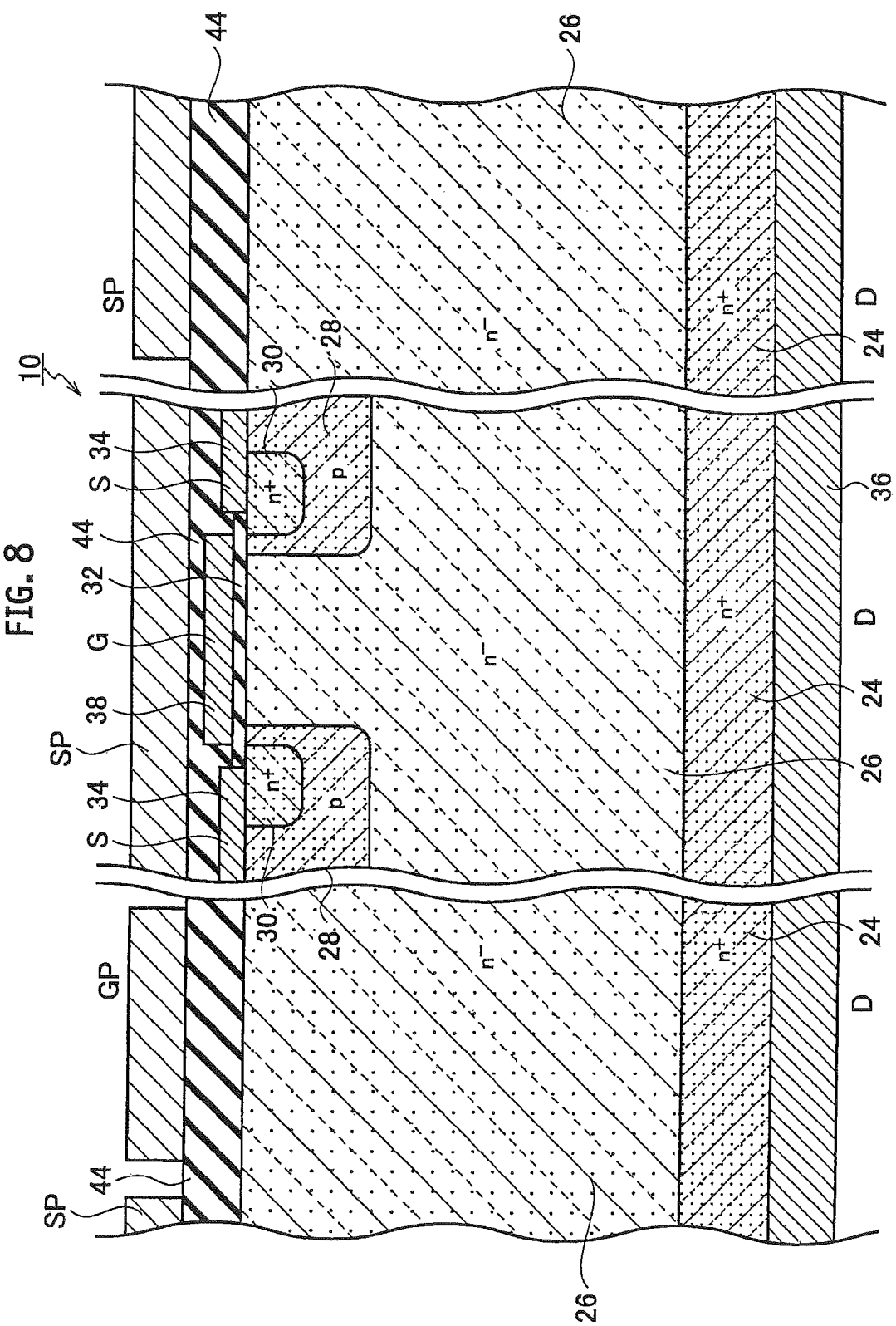
FIG. 8 shows an example of the semiconductor chip applied to the semiconductor device according to the embodiment, and is a schematic cross-sectional configuration diagram showing the SiC-MOSFET including a source pad electrode SP and a gate pad electrode GP.

FIG. 8 shows an example of the semiconductor module 10 applied to the semiconductor device 1 according to the embodiment, and is a schematic cross-sectional configuration diagram showing the SiC-MOSFET including a source pad electrode SP and a gate pad electrode GP. The gate pad electrode GP is connected to the gate electrode 38 disposed on the gate insulating film 32, and the source pad electrode SP is connected to the source electrode 34 connected to the source region 30.

As shown in FIG. 8, the gate pad electrode GP and the source pad electrode SP are disposed on the interlayer insulating film 44 for passivation which covers the surface of the semiconductor chip 10. In addition, although omitting an illustration in the configuration example of FIG. 8, a miniscule transistor structure may be formed in the semiconductor substrate 26 under the gate pad electrode GP and the source pad electrode SP, in the same manner as that of FIG. 7 or the central part of FIG. 8.

As shown in FIG. 8, the source pad electrode SP may be disposed to extend onto the interlayer insulating film 44 for passivation, also in the transistor structure of the central part.

Alternatively, the gate pad electrode GP may be disposed to extend onto the interlayer insulating film 44 for passivation, in the transistor structure of the central part of FIG. 8.

(Example Applications for Applying Semiconductor Device)

Figure 9:
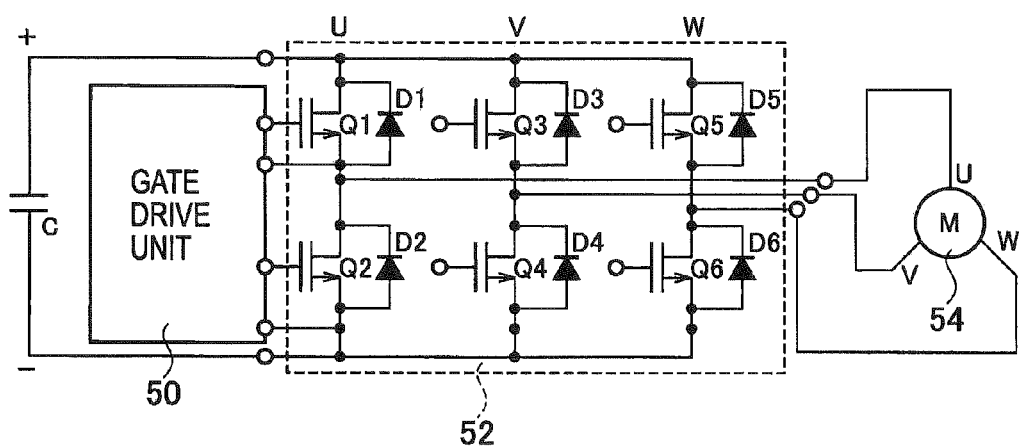
FIG. 9 is a schematic circuit configuration diagram showing a three-phase Alternating Current (AC) inverter configured to applying the semiconductor device according to the embodiment.

Next, a three-phase alternating current (AC) inverter configured to use the semiconductor device 1 according to the embodiment is explained, with reference to FIG. 9.

As shown in FIG. 9, the three-phase AC inverter includes: a gate drive unit 50, a power module unit 52 connected to the gate drive unit 50, and a three-phase Alternating Current (AC) motor unit 54. Inverters of U phase, V phase and W phase are connected to the power module unit 52 corresponding to U phase, V phase, and W phase of the three-phase AC motor unit 54.

As for the power module unit 52, SiC-MOSFETs Q1 and Q2, Q3 and Q4, and Q5 and Q6 having inverter configurations are connected between a positive terminal (+) and a negative terminal (−) to in which the capacitor C is connected. Furthermore, diodes D1 to D6 are connected inversely in parallel between the source and the drain of SiC-MOSFETs Q1 to Q6, respectively.

As mentioned above, the SiC-MOSFETs Q1 to Q6 equivalent to the semiconductor chip 10 applied to the semiconductor device 1 according to the embodiment are electrically connected on the mounting substrate 70 or the heat spreader 100 via the solid phase diffusion bonding layers 48G, 48S, 48D and 48H.

(Solid Phase Diffusion Bonding Process)

An actual solid phase diffusion bonding process is performed, after forming GC, Ag, Au, Ti, Ni, etc. on the surface of the materials of the source connector SC and the gate connector by using the plating technology, the sputtering technology, or the vacuum evaporation technology, and forming Ag, Au, Ti, Ni, etc. on the surface of source pad electrode SP and the gate pad electrode GP of the semiconductor chip 10 by using plating technology, sputtering technology, or vacuum evaporation technology.

In a solid phase diffusion bonding process, high pressure (e.g., about 10 MPa to about 100 MPa) is applied and heat (e.g., about 200 degrees C. to about 350 degrees C.) is added at the time of the process. Firstly, plastic deformation is caused by the pressure applied in order to contact surfaces of two materials to be bonded, and then atomic diffusion is further caused by the heat added thereto, thereby bonding the two materials.

In the fabrication method of the semiconductor device 1 according to the embodiment, bonding between the drain pad electrode 36 and the insulating substrate 8 is also achievable by the above-mentioned solid phase diffusion bonding process.

The pressure is from an upper part of the source connector SC and the gate connector GC, and also applied from a lower part of the insulating substrate 8. The heat is further added at the same time, and thereby the solid phase diffusion bonding process is performed.

Figure 10A:
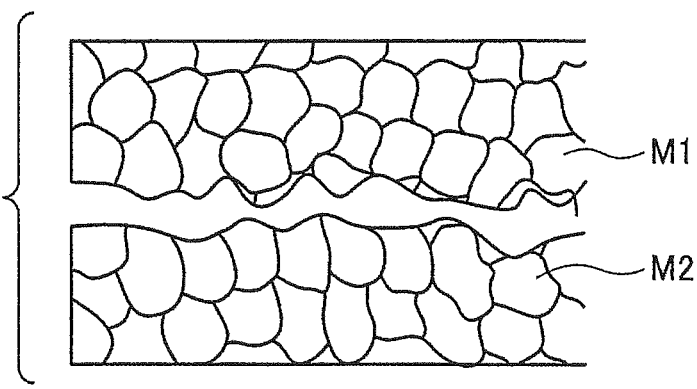
FIG. 10A is a diagram for explaining a solid phase diffusion bonding process applied to a fabrication method for the semiconductor device according to the embodiment, and is a schematic cross-sectional configuration diagram showing an aspect that two metallic materials are opposed mutually.
Figure 10B:
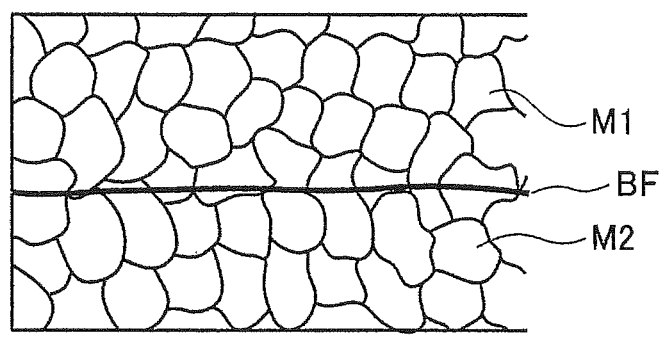
FIG. 10B is a diagram for explaining the solid phase diffusion bonding process applied to the fabrication method for the semiconductor device according to the embodiment, and is a schematic cross-sectional configuration diagram showing an aspect that two metallic materials are contacted to be opposed mutually and their contact interface becomes deformed under high pressure.
Figure 10C:
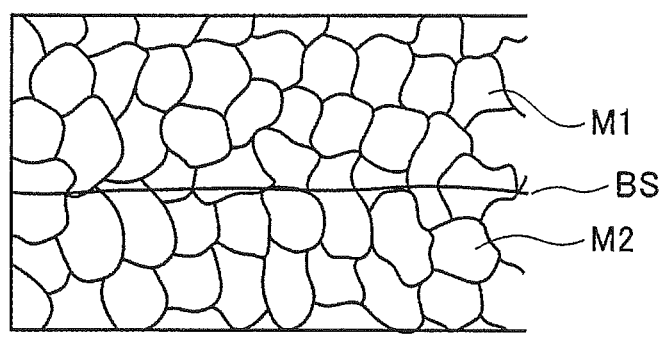
FIG. 10C is a diagram for explaining the solid phase diffusion bonding process applied to the fabrication method for the semiconductor device according to the embodiment, and is a schematic cross-sectional configuration diagram showing an aspect that the contact interface disappears completely and only one interface surface is formed.
Figure 10D:
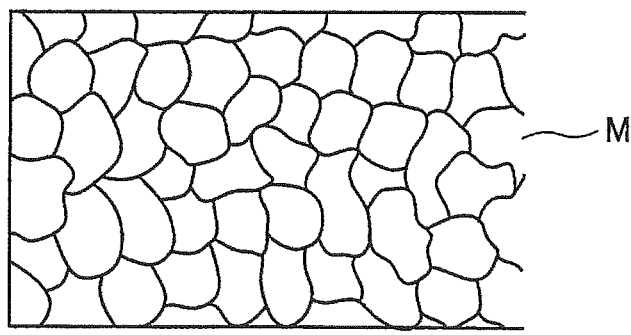
FIG. 10D is a diagram for explaining the solid phase diffusion bonding process applied to the fabrication method for the semiconductor device according to the embodiment, and is a schematic cross-sectional configuration diagram showing an aspect that the interface surface is removed by atomic diffusion and seamless solid phase diffusion bonding is formed.

FIG. 10A is a diagram for explaining a solid phase diffusion bonding process applied to the fabrication method for the semiconductor device 1 according to the embodiment, and is a schematic cross-sectional configuration diagram showing an aspect that two metallic materials M1 and M2 are opposed mutually. FIG. 10B is a schematic cross-sectional configuration diagram showing an aspect that the two metallic materials M1 and M2 are contacted to be opposed mutually and their contact interface BF becomes plastic-deformed under the high pressure. FIG. 10C is a schematic cross-sectional configuration diagram showing an aspect that the contact interface BF disappears completely and only one interface surface BS is formed. FIG. 10D is a schematic cross-sectional configuration diagram showing an aspect that the interface surface BS is removed by atomic diffusion and seamless solid phase diffusion bonding is formed.

(a) First of all, as shown in FIG. 10A, the two metallic materials M1 and M2 are opposed mutually to be adjacent to each other.
(b) Next, the two metallic materials M1 and M2 are opposed mutually to be contacted to each other, high pressure (e.g., not less than about 1 MPa but not more than about 100 MPa) is applied thereto, and thereby the contact interface BF is plastic-deformed, as shown in FIG. 10B.
(c) Next, under the above-mentioned high pressure, when the heating process is performed, the contact interface BF disappears completely and then only one interface surface BS is formed, as shown in FIG. 10C. The heating processing temperature at this time is not less than about 200 degrees C. but not more than about 350 degrees C., for example.
(d) When continuing the heating process under the above-mentioned high pressure, the interface surface BS of the two metallic materials M1 and M2 are removed by the atomic diffusion, and thereby forming a seamless solid phase diffusion bond, as shown in FIG. 10D.

Figure 11A:
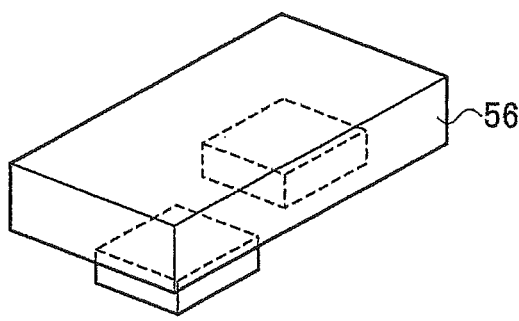
FIG. 11A is a diagram for explaining a drain solid phase diffusion bonding process applied to the fabrication method for the semiconductor device according to the embodiment, and is a schematic bird's-eye view configuration diagram showing an upper member used for applying pressure to the semiconductor chips.
Figure 11B:
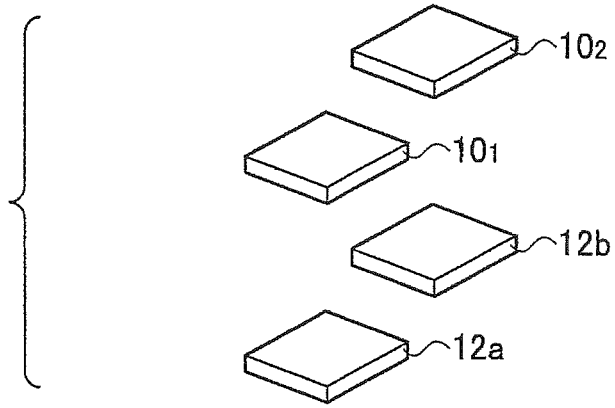
FIG. 11B is a diagram for explaining the drain solid phase diffusion bonding process applied to the fabrication method for the semiconductor device according to the embodiment, and is a schematic bird's-eye view configuration diagram showing the semiconductor chips and interlayer metals.
Figure 11C:
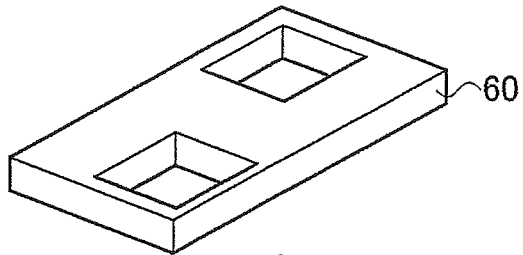
FIG. 11C is a diagram for explaining the drain solid phase diffusion bonding process applied to the fabrication method for the semiconductor device according to the embodiment, and is a schematic bird's-eye view configuration diagram showing an intermediate member used for inserting the semiconductor chips and the interlayer metals.
Figure 11D:
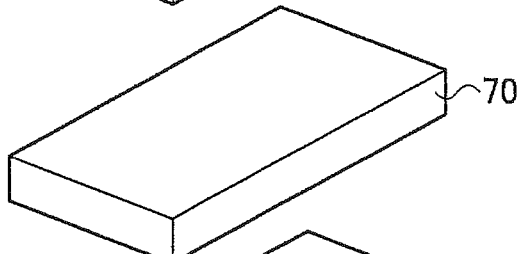
FIG. 11D is a diagram for explaining the drain solid phase diffusion bonding process applied to the fabrication method for the semiconductor device according to the embodiment, and is a schematic bird's-eye view configuration diagram showing a mounting substrate used for mounting the semiconductor chips and the interlayer metals.
Figure 11E:
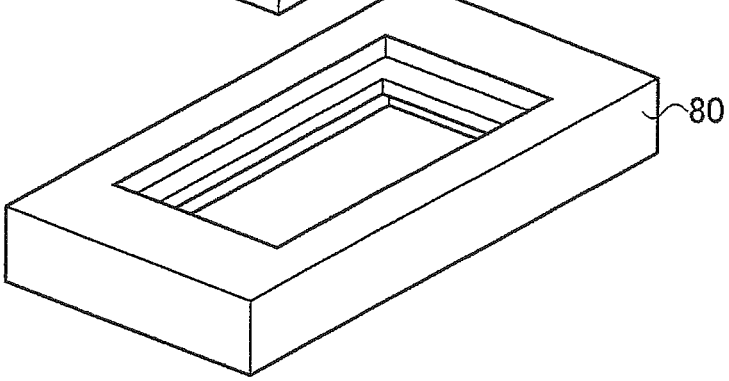
FIG. 11E is a diagram for explaining the drain solid phase diffusion bonding process applied to the fabrication method for the semiconductor device according to the embodiment, and is a schematic bird's-eye view configuration diagram showing a lower member used for inserting the mounting substrates and applying pressure to the semiconductor chips.

FIG. 11A is a diagram for explaining a drain solid phase diffusion bonding process applied to the fabrication method for the semiconductor device 1 according to the embodiment, and is a schematic bird's-eye view configuration diagram showing an upper member 56 used for applying the pressure from an upper side to the semiconductor chips 10₁ and 10₂. FIG. 11B is a schematic bird's-eye view configuration diagram showing the semiconductor chips 10₁ and 10₂ and the interlayer metals 12a and 12b. FIG. 11C is a schematic bird's-eye view configuration diagram showing an intermediate member 60 used for inserting the semiconductor chips 10₁ and 10₂ and the interlayer metals 12a and 12b. FIG. 11D is a schematic bird's-eye view configuration diagram showing the mounting substrate 70 used for mounting the semiconductor chips 10₁ and 10₂ and the interlayer metals 12a and 12b. FIG. 11E is a schematic bird's-eye view configuration diagram showing a lower member 80 used for inserting the mounting substrates 70 and applying the pressure from an under side to the semiconductor chips 10₁ and 10₂.

Figure 12A:
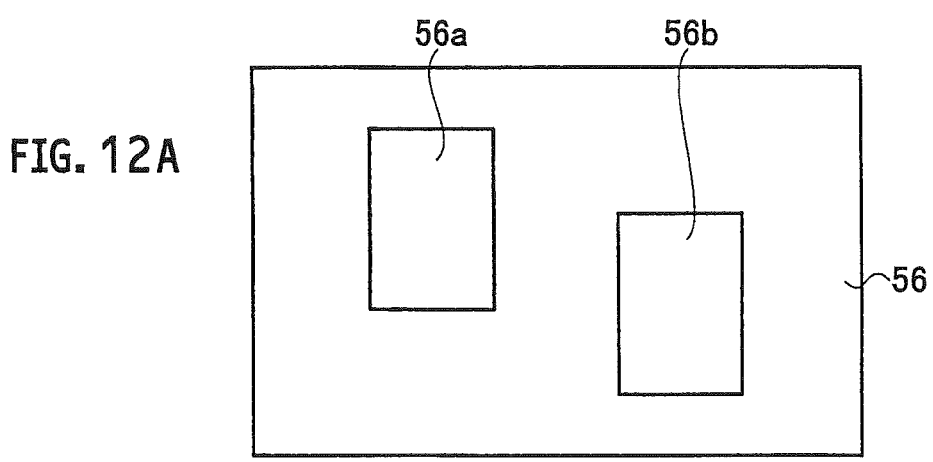
FIG. 12A is a schematic planar pattern configuration diagram observing the upper member of FIG. 11A from a back side surface thereof.
Figure 12B:
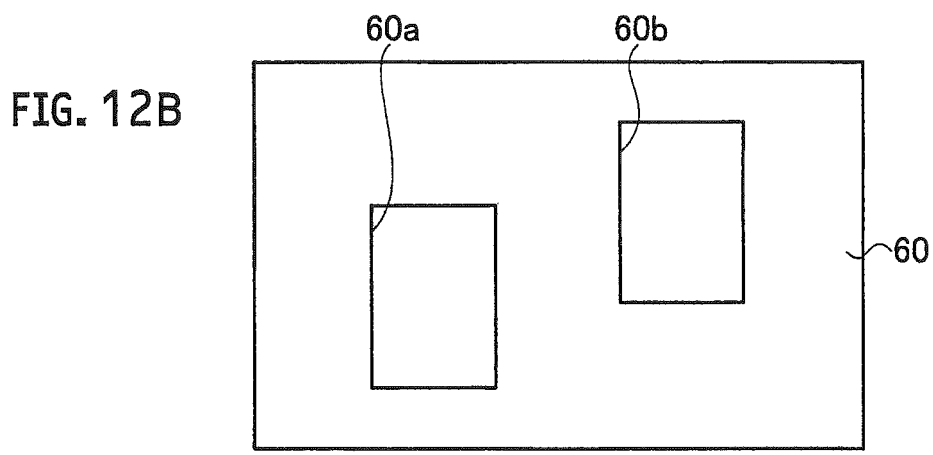
FIG. 12B is a schematic planar pattern configuration diagram observing the intermediate member of FIG. 11C from a surface thereof.

On the other hand, FIG. 12A is a schematic planar pattern configuration diagram observing the upper member 56 of FIG. 11A from a back side surface thereof. FIG. 12B is a schematic planar pattern configuration diagram observing the intermediate member 60 of FIG. 11C from a surface thereof.

Figure 13:
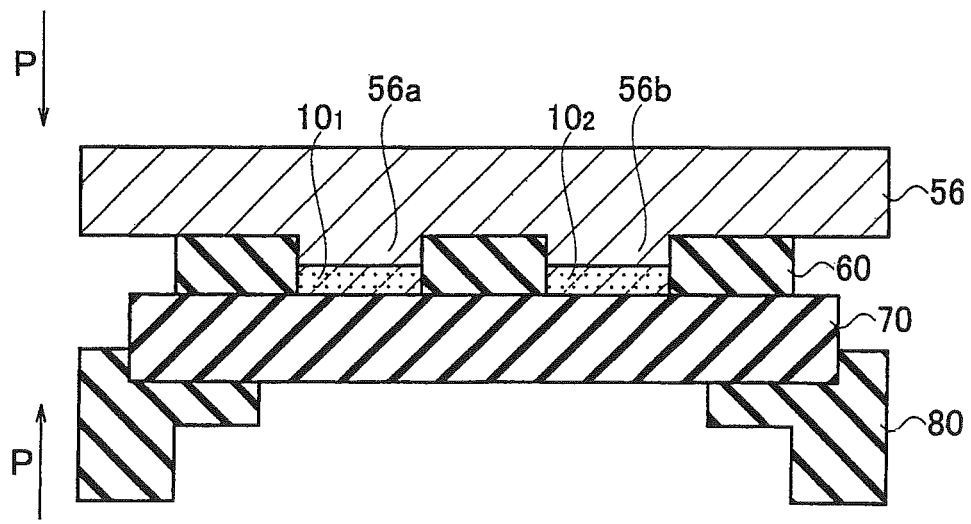
FIG. 13 is a schematic cross-sectional configuration diagram for explaining an aspect that the configuration of FIG. 11 is assembled and then a pressure/heating process is subjected thereto, in the fabrication method for the semiconductor device according to the embodiment.

FIG. 13 is a schematic cross-sectional configuration diagram for explaining an aspect that the configuration of FIG. 11 is assembled and then the pressure/heating process is subjected thereto, in the fabrication method for the semiconductor device 1 according to the embodiment. In addition, the interlayer metals 12a and 12b are omitted in FIG. 13.

The upper member 56 includes convex regions 56a and 56b for applying the pressure from an upper side to the semiconductor chips 10₁ and 10₂, as shown in FIGS. 11A, 12A and 13. Also, the intermediate member 60 includes openings 60a and 60b for inserting the semiconductor chips 10₁ and 10₂ and the interlayer metals 12a and 12b, as shown in FIGS. 11C and 12B.

The interlayer metals 12a and 12b are not necessarily required. However, when the surface of the mounting substrate 70 is rough, the interlayer metals 12a and 12b are useful in view of the fact that the contact between the surface of the drain pad electrode 36 and the surface of the mounting substrate 70 should be enhanced, and the formation of the drain solid phase diffusion bonding layer should be enhanced. The interlayer metals 12a and 12b can be formed of solder, such as Ag, or a platy member of Ag, Au, Ti, Ni, etc.

Figure 14:
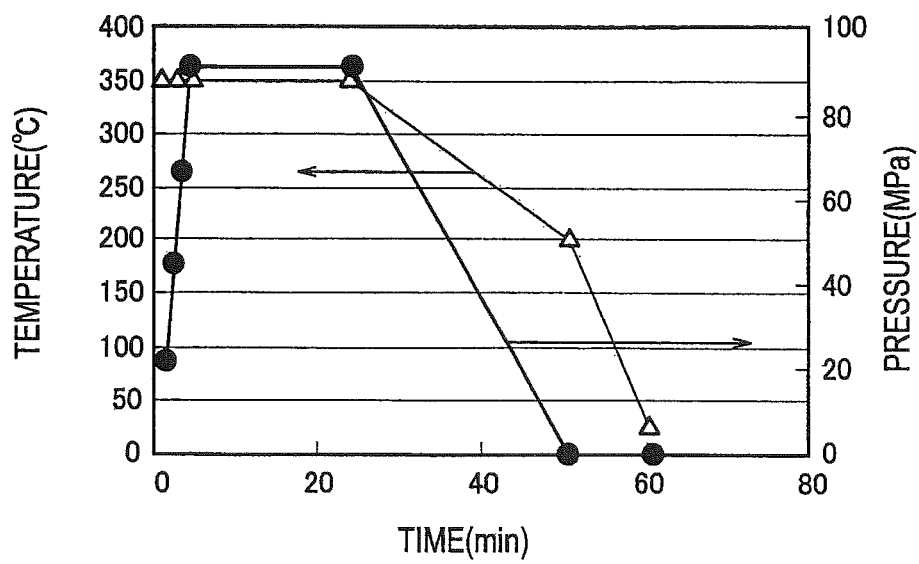
FIG. 14 shows an example of a temperature profile and an example of a pressure profile under the pressure/heating process, in the fabrication method for the semiconductor device according to the embodiment.

FIG. 14 shows an example of a temperature profile and an example of a pressure profile under the drain solid phase diffusion bonding process. In the example of FIG. 14, the pressure of about 90 MPa is applied in an initial state. Then, while this pressure is held, the heating processing temperature is risen from room temperature to 350 degrees C. within about 5 minutes. Next, the pressure of about 90 MPa and the heating processing temperature at about 350 degrees C. are held during about 20 minutes. Next, during about 25 minutes, the pressure is reduced from about 90 MPa to atmospheric pressure, and the heating processing temperature is reduced from about 350 degrees C. to about 200 degrees C. Next, during about 25 minutes, the heating processing temperature is reduced from about 200 degrees C. to room temperature. As clearly shown in FIG. 14, since the pressure/heating process is completed within about 1 hour, shortening of the process time can be achieved by optimizing the aforementioned process.

Figure 15:
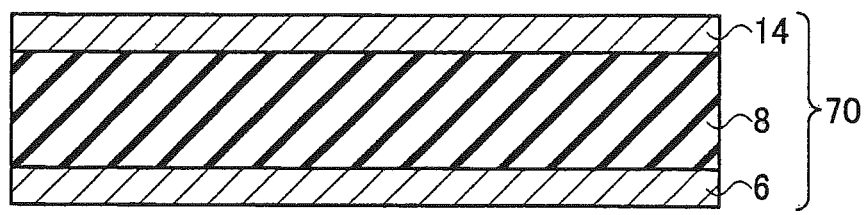
FIG. 15 is a schematic cross-sectional configuration diagram showing a mounting substrate applied to the fabrication method for the semiconductor device according to the embodiment.
Figure 16:
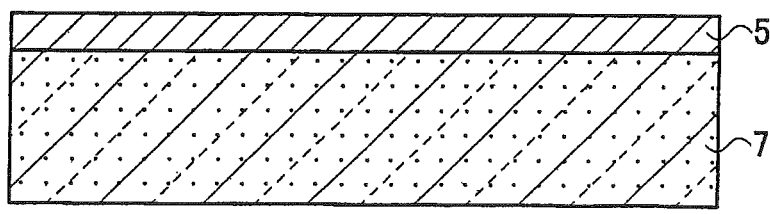
FIG. 16 is a schematic cross-sectional configuration diagram showing a semiconductor substrate applied to the fabrication method for the semiconductor device according to the embodiment.

As shown in FIG. 15, a schematic cross-sectional configuration of the mounting substrate 70 applied to the semiconductor device according to the embodiment may include metal layers 14 and 6 formed on the surface and the back side surface of the insulating substrate 8. Since a low roughness substrate surface is required in order to form the drain solid phase diffusion bond, semiconductor substrates 7 (e.g., a silicon wafer) are also applicable instead of the mounting substrate 70, as shown in FIG. 16. In the example of FIG. 16, a metal layer 5 is formed on the semiconductor substrate 7.

The metal layers 14, 6, and 5 can be formed of Ag, Au, Ti, Ni, etc. using the plating technology, the sputtering technology, or the vacuum evaporation technology.

Figure 17:
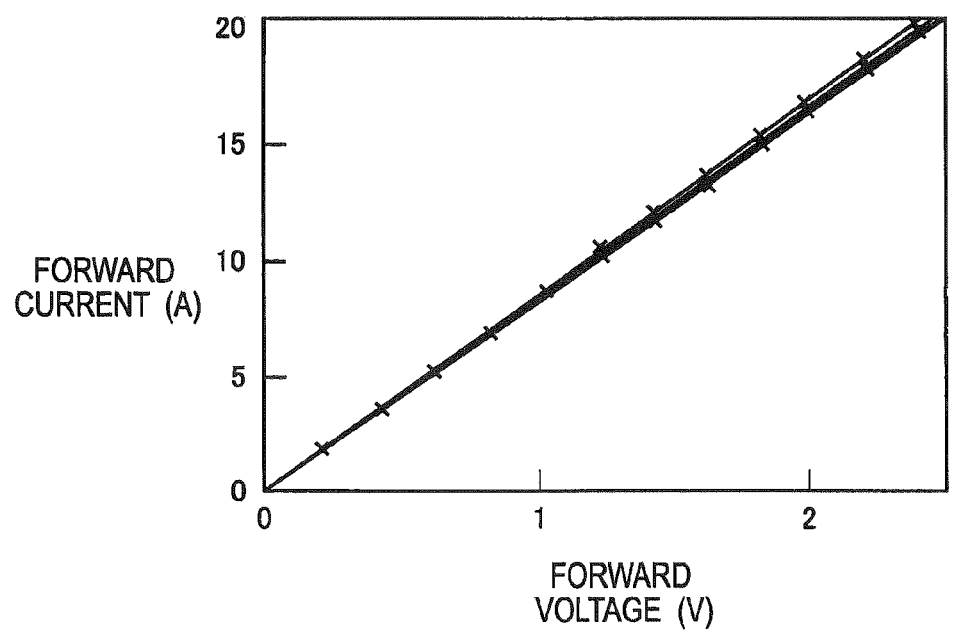
FIG. 17 shows an example of forward current-voltage characteristics in ON state of the semiconductor device according to the embodiment.

FIG. 17 shows an example of forward current-voltage characteristics in ON state of the semiconductor device according to the embodiment. A plurality of curves in FIG. 17 corresponds to a plurality of lots. As clearly shown in FIG. 17, in the semiconductor device according to the embodiment 1, almost equivalent forward current-voltage characteristics are obtained over the plurality of lots.

(Die Shear Strength Test)

In the semiconductor device according to the embodiment 1, as a result of performing a die shear strength test about the drain solid phase diffusion bonding between the drain pad electrode 36 and the insulating substrate 8 of the semiconductor chip 10, same grade bonding as a conventional Pb solder bonding or high intensity bonding rather than the conventional Pb solder bonding is obtained under the room temperature or under the environment of 300 degrees C.

(Thermal Cycle Test)

Figure 18:
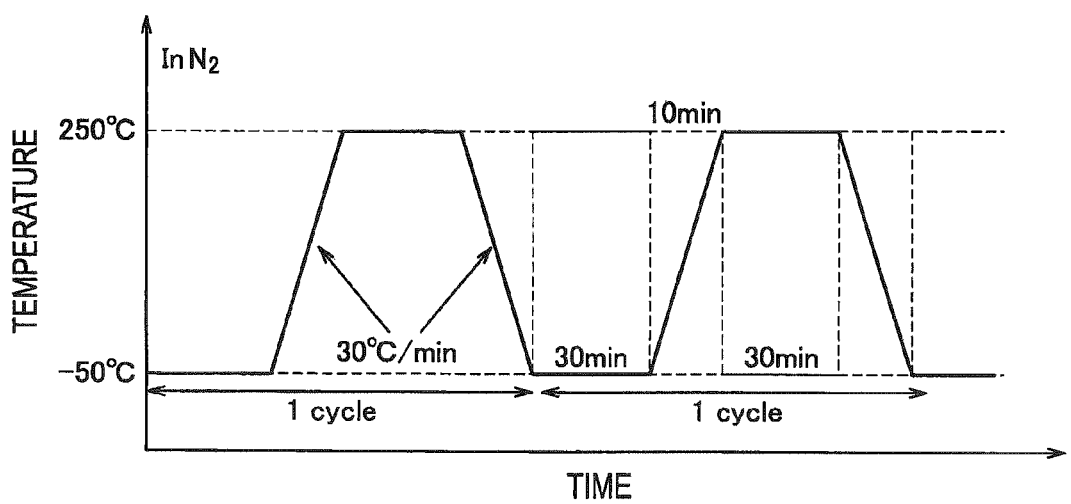
FIG. 18 shows an example of a temperature profile under a thermal cycle test subjected to the semiconductor device according to the embodiment.

FIG. 18 shows an example of a temperature profile under a thermal cycle test subjected to the semiconductor device 1 according to the embodiment. The thermal cycle test was performed over a range from −50 degrees C. to +250 degrees C. under a nitrogen atmosphere. A time period of one heat cycle is 80 minutes. The breakdown of one heat cycle is as follows: a time period at a temperature of −50 degrees C. is 30 minutes; a heating time period at a temperature from −50 degrees C. to +250 degrees C. is 10 minutes; a time period at a temperature of +250 degrees C. is 30 minutes; and the cooling time period at a temperature from +250 degrees C. to −50 degrees C. is 10 minutes. Characteristic degradation is not observed as a result of measuring the value of the forward voltage drop Vf and the value of the reverse breakdown voltage Vr every 100 cycles. As a result of measuring the value of the on resistance at the time of 70 cycles, substantial characteristic degradation is not also observed as compared with the value of the on resistance at the time of 0 cycles.

Bonding strength of the solid phase diffusion bonding layers 48S, 48G, 48D and 48H formed by using the fabrication method of the semiconductor device according to the embodiment 1 is sufficiently secured as a result of the above thermal cycle test.

(Simultaneous Forming Process of Source Solid Phase Diffusion Bonding and Drain Solid Phase Diffusion Bonding)

Figure 19A:
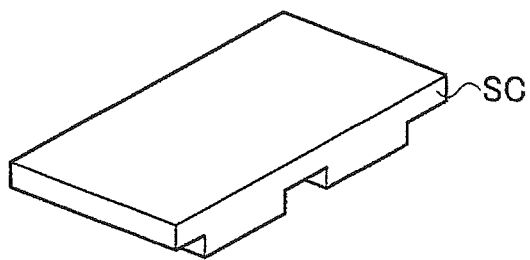
FIG. 19A is a diagram for explaining a source solid phase diffusion bonding process applied to the fabrication method for the semiconductor device according to the embodiment, and is a schematic bird's-eye view configuration diagram showing a source connector.
Figure 19B:
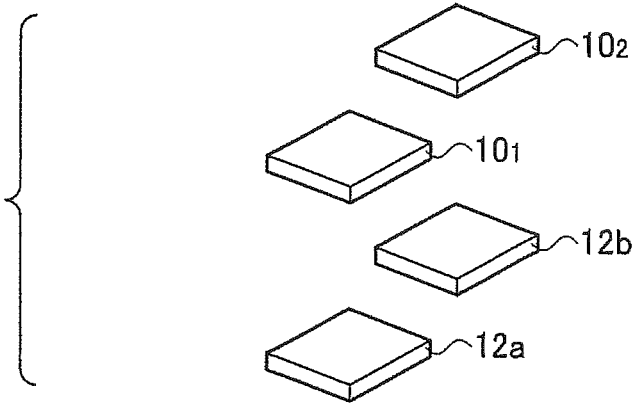
FIG. 19B is a diagram for explaining the source solid phase diffusion bonding process applied to the fabrication method for the semiconductor device according to the embodiment, and is a schematic bird's-eye view configuration diagram showing the semiconductor chips and the interlayer metals.
Figure 19C:
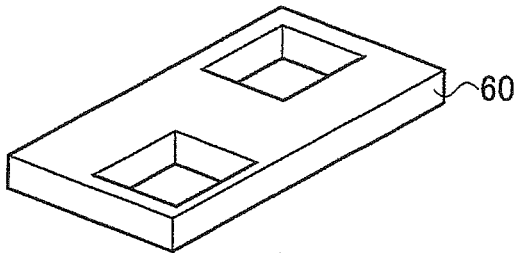
FIG. 19C is a diagram for explaining the source solid phase diffusion bonding process applied to the fabrication method for the semiconductor device according to the embodiment, and is a schematic bird's-eye view configuration diagram showing the intermediate member used for inserting the semiconductor chips and the interlayer metals.
Figure 19D:
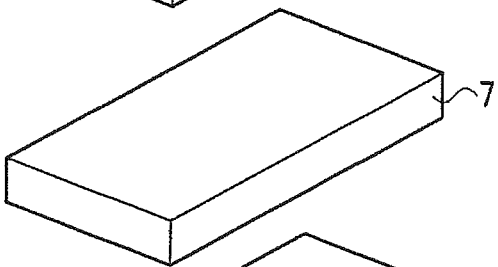
FIG. 19D is a diagram for explaining the source solid phase diffusion bonding process applied to the fabrication method for the semiconductor device according to the embodiment, and is a schematic bird's-eye view configuration diagram showing the semiconductor substrate used for mounting the semiconductor chips and the interlayer metals.
Figure 19E:
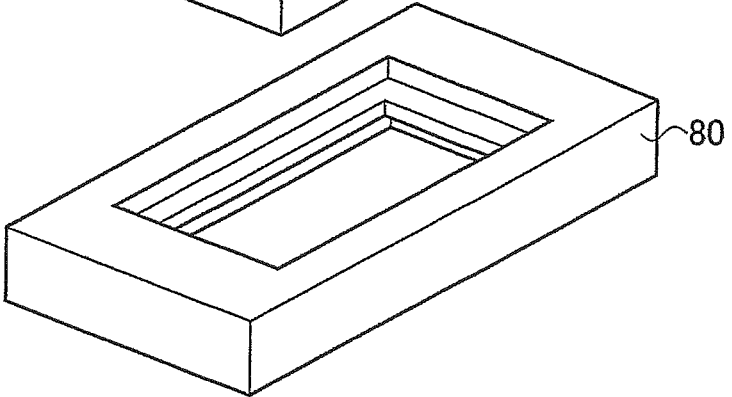
FIG. 19E is a diagram for explaining the source solid phase diffusion bonding process applied to the fabrication method for the semiconductor device according to the embodiment, and is a schematic bird's-eye view configuration diagram showing the lower member used for inserting the semiconductor substrate.

FIG. 19A is a diagram for explaining a source solid phase diffusion bonding process applied to the fabrication method for the semiconductor device 1 according to the embodiment, and is a schematic bird's-eye view configuration diagram showing a source connector SC used for applying pressure from an upper side to the semiconductor chips $10_1$ and $10_2$. FIG. 19B shows a schematic bird's-eye view structure of the semiconductor chips $10_1$ and $10_2$ and the interlayer metals 12a and 12b. FIG. 19C is a schematic bird's-eye view configuration diagram showing the intermediate member 60 used for inserting the semiconductor chips $10_1$ and $10_2$ and the interlayer metals 12a and 12b. FIG. 19D shows a schematic bird's-eye view structure of the semiconductor substrate 7 for mounting the semiconductor chips $10_1$ and $10_2$ and the interlayer metals 12a and 12b. FIG. 19E is a schematic bird's-eye view configuration diagram showing a lower member 80 used for inserting the semiconductor substrate 7 and applying the pressure from an under side to the semiconductor chips $10_1$ and $10_2$.

The interlayer metals 12a and 12b are not necessarily required. However, when the surface of the semiconductor substrate 7 is rough, the interlayer metals 12a and 12b are useful, in view of the fact that the contact between the surface of the drain pad electrode 36 and the surface of the semiconductor substrate 7 should be enhanced, and the formation of the drain solid phase diffusion bonding layer should be enhanced. The interlayer metals 12a and 12b can be formed of solder, such as Ag, or a platy member of Ag, Au, Ti, Ni, etc.

Although an example of use of the semiconductor substrate 7 instead of the mounting substrate 70 is shown in FIG. 19, the mounting substrate 70 may be also used in the same manner as shown in FIG. 11.

The similar example of the profile as shown in FIG. 14 can be also applied as an example of the temperature profile and an example of the pressure profile, in the source solid phase diffusion bonding process between the source pad electrode SP and the source connector SC, and the gate solid phase diffusion bonding process between the gate pad electrode GP and the gate connector GC, same as that of the drain solid phase diffusion bonding process.

Figure 20A:
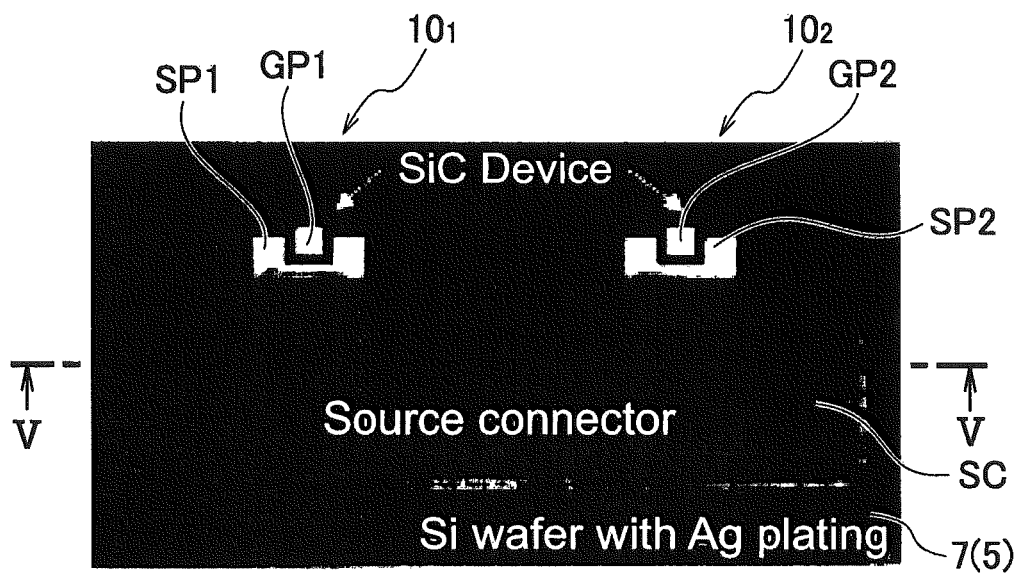
FIG. 20A shows an example of a photograph of a surface of the semiconductor device according to the embodiment formed by assembling the configuration of FIG. 19 and then subjecting the pressure/heating process thereto.
Figure 20B:
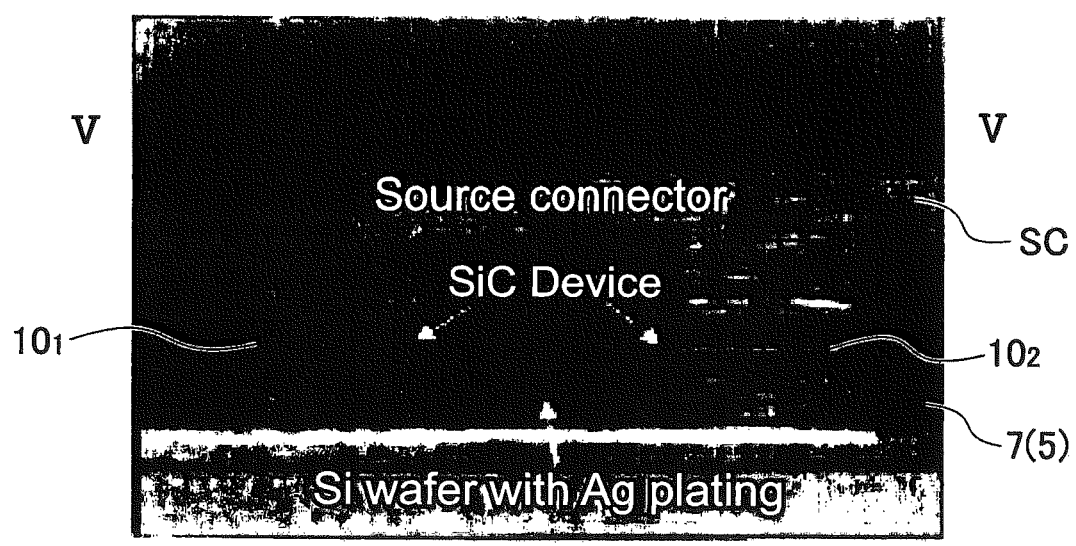
FIG. 20B shows an example of a photograph of cross-sectional structure taken in the line V-V of FIG. 20A.

FIG. 20A shows an example of a photograph of the surface of the semiconductor device according to the embodiment formed by assembling the configuration of FIG. 19 and then subjecting the pressure/heating process thereto. FIG. 20B shows an example of a photograph of cross-sectional structure taken in the line V-V of FIG. 20A.

In the examples shown in FIG. 19 and FIG. 20, the drain solid phase diffusion bonding layer 48D is formed between the semiconductor substrate 7 and the drain pad electrode 36 at the same time of forming the source solid phase diffusion bonding layer 48S between source connector SC and the source pad electrode SP.

Figure 21:
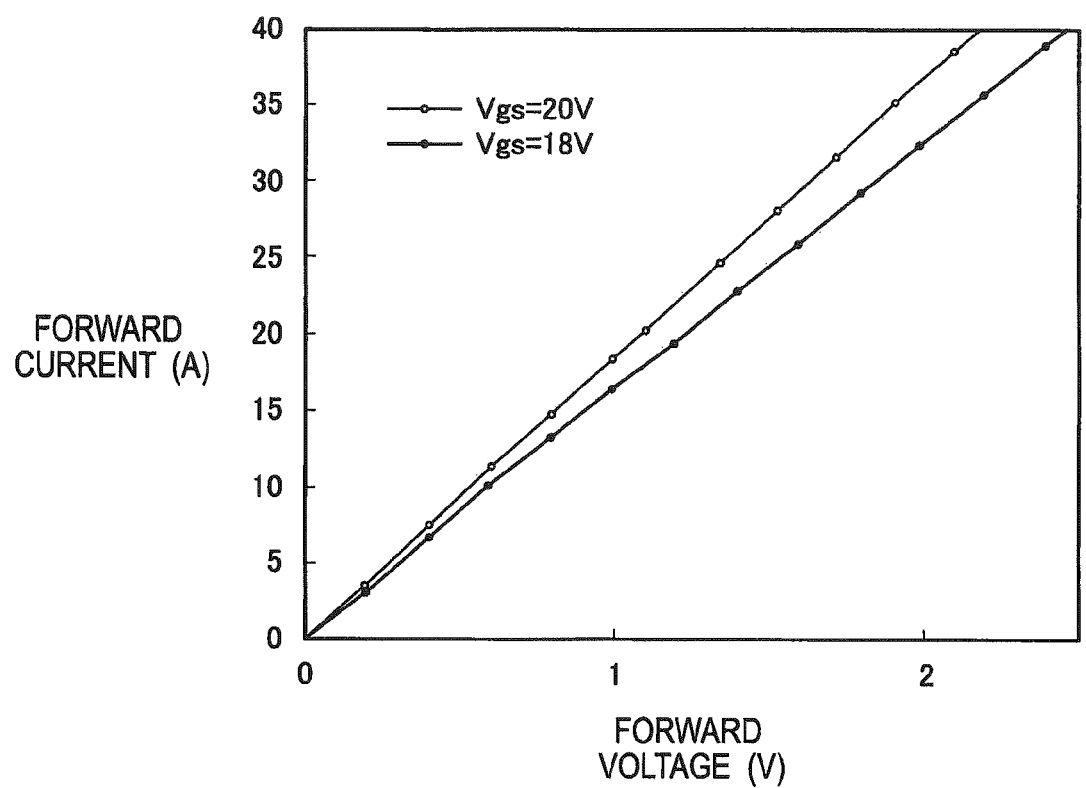
FIG. 21 shows an example of forward current-voltage characteristics in ON state of the semiconductor device according to the embodiment in which the source solid phase diffusion bonding and the drain solid phase diffusion bonding are formed by simultaneous processes.

FIG. 21 shows an example of forward current-voltage characteristics in ON state of the semiconductor device 1 according to the embodiment in which the drain solid phase diffusion bonding layer 48D is formed at the same time of forming the source solid phase diffusion bonding layer 48S. It is confirmed that the characteristic degradation of the semiconductor chip 10 does not occur even when the source solid phase diffusion bonding layer 48S and the drain solid phase diffusion bonding layer 48D are simultaneously formed.

According to the semiconductor device, according to the embodiment and the fabrication method for such semiconductor device, since the solid phase diffusion bonding layer is the melting point specific to Ag or Au, the semiconductor chip can be driven at high temperature by applying the solid phase diffusion bonding layer to the SiC or GaN based power device etc.

According to the embodiment, since the electrical conductivity and thermal conductivity of the solid phase diffusion bonding layer are higher than those of the conventional low melting point solder, the semiconductor device having an enhanced electrical and thermal efficiency is achievable.

According to the semiconductor device and according to the embodiment and the fabrication method for such semiconductor device, since the solid phase diffusion bonding layer having the high melting point can be formed under the low-temperature process, damage to the materials can be reduced at the time of the fabricating process.

According to the embodiment, since the diffusion bond process temperature and time is similar to a conventional high melting point Pb based solder, it can be mass produced using this packaging approach.

According to the semiconductor device according to the embodiment and the fabrication method for such semiconductor device, large capacity, mass production, shortening of process time, and simplification of processes are easily achievable, since the structure of disposing a plurality of the semiconductor chips in parallel can be also formed in a simultaneous processes.

In the semiconductor device according to the embodiment and the fabrication method for such semiconductor device, since the electrode connection by solid phase diffusion bonding is performed in the source pad electrode SP, a wirebondless structure can be achieved. Accordingly, parasitic inductances are significantly reduced compared to conventional wire bonds, and therefore high speed switching performance and high frequency driving performance can be achieved.

According to the present invention, it can provide the semiconductor device with double-sided cooling in which the process temperature and time can be reduced using the solid phase diffusion bonding process.

Other Embodiments

While the present invention is described in accordance with the aforementioned embodiment, it should be understood that the description and drawings that configure part of this disclosure are not intended to limit the present invention. This disclosure makes clear a variety of alternative embodiments, working examples, and operational techniques for those skilled in the art.

Such being the case, the present invention covers a variety of embodiments, whether described or not.

INDUSTRIAL APPLICABILITY

The semiconductor device of a present invention can be used in general power devices (e.g., a power semiconductor module, an intelligent power module).

What is claimed is:

1. A semiconductor device comprising:
   a mounting substrate;
   a plurality of semiconductor chips disposed on the mounting substrate, each semiconductor chip comprising a semiconductor substrate, a source pad electrode and a gate pad electrode disposed on a surface of the semiconductor substrate, and a drain pad electrode disposed on a back side surface of the semiconductor substrate that contacts the mounting substrate;
   a source connector disposed so as to commonly connect a plurality of the source pad electrodes, the source connector disposed on a surface of each of the source pad electrodes on an opposite side to the mounting substrate;
   a gate connector disposed so as to commonly connect a plurality of the gate pad electrodes, the gate connector disposed on a surface of each of the gate pad electrodes on an opposite side to the mounting substrate, the gate connector being a connector separated from the source connector,
   a plurality of interlayer metals, respective interlayer metals being inserted between respective semiconductor chips and the mounting substrate; and
   an intermediate member including openings configured to hold the plurality of semiconductor chips and the plurality of interlayer metals, respective openings being formed so as to hold respective pairs of a semiconductor chip of the plurality of semiconductor chips and an interlayer metal of the plurality of interlayer metal, the intermediate member disposed on the mounting substrate,
   wherein a plurality of the drain pad electrodes are bonded to the mounting substrate by solid phase diffusion bonding;
   wherein the source connector includes a plurality of convex regions, the source connector is disposed on the plurality of the source pad electrodes so that the respective convex regions of the source connector are opposed to the respective source pad electrodes, and
   the gate connector includes a plurality of convex regions, the gate connector is disposed on the plurality of the gate pad electrodes so that the respective convex regions of the gate connector are opposed to the respective gate pad electrodes.

2. The semiconductor device according to claim 1 further comprising
   a heat spreader configured to mount the mounting substrate, wherein
   the mounting substrate and the heat spreader are bonded by solid phase diffusion bonding.

3. The semiconductor device according to claim 1, wherein
   the source pad electrode and the source connector are bonded by solid phase diffusion bonding.

4. The semiconductor device according to claim 1, wherein
   the gate pad electrode and the gate connector are bonded by solid phase diffusion bonding.

5. The semiconductor device according to claim 3, wherein
   the source connector and a plurality of the source pad electrodes of the plurality of semiconductor chips are simultaneously bonded by solid phase diffusion bonding.

6. The semiconductor device according to claim 4, wherein
   the gate connector and a plurality of the gate pad electrodes of the plurality of semiconductor chips are simultaneously bonded by solid phase diffusion bonding.

7. The semiconductor device according to claim 1, wherein
   the mounting substrate comprises an insulating substrate and a first metal layer disposed on a surface of the insulating substrate, and
   the semiconductor device further comprising a drain solid phase diffusion bonding layer of the first metal layer and the drain pad electrode, the solid phase diffusion bonding layer being disposed between the mounting substrate and the drain pad electrode.

8. The semiconductor device according to claim 1 further comprising
   a source solid phase diffusion bonding layer formed between the source pad electrode and the source connector by solid phase diffusion bonding.

9. The semiconductor device according to claim 1 further comprising
   a gate solid phase diffusion bonding layer arranged between the gate pad electrode and the gate connector using solid phase diffusion bonding.

10. The semiconductor device according to claim 2, wherein
    the mounting substrate comprises an insulating substrate and a second metal layer disposed on a back side surface of the insulating substrate, and
    the semiconductor device further comprising a heat spreader solid phase diffusion bonding layer of the second metal layer and the heat spreader, the heat spreader solid phase diffusion bonding layer being disposed between the mounting substrate and the heat spreader.

11. The semiconductor device according to claim 7, wherein
    the drain solid phase diffusion bonding layer comprises one or more kinds of metals selected from the group consisting of Ag, Au, Ti and Ni, using the solid phase diffusion bonding.

12. The semiconductor device according to claim 8, wherein
    the source solid phase diffusion bonding layer comprises bonding one or more kinds of metals selected from the group consisting of Ag, Au, Ti and Ni, using the solid phase diffusion bonding.

13. The semiconductor device according to claim 9, wherein
    the gate solid phase diffusion bonding layer comprises bonding one or more kinds of metals selected from the group consisting of Ag, Au, Ti and Ni, using the solid phase diffusion bonding.

14. The semiconductor device according to claim 10, wherein
    the heat spreader solid phase diffusion bonding layer comprises bonding one or more kinds of metals selected from the group consisting of Ag, Au, Ti and Ni, using the solid phase diffusion bonding.

15. The semiconductor device according to claim 1, wherein
the source connector is formed of one selected from the group consisting of Al, Cu, CuMo, CuW, and AlSiC.

16. The semiconductor device according to claim 4, wherein
the gate connector is formed of one selected from the group consisting of Al, Cu, CuMo, CuW, and AlSiC.

17. The semiconductor device according to claim 1, wherein
the semiconductor chip is a power device of one selected from the group consisting of an SiC based power device, a GaN based power device, and an AlN based power device.

18. The semiconductor device according to claim 1, wherein
the semiconductor device uses a semiconductor having a bandgap energy of 1.1 eV to 8 eV.

19. The semiconductor device according to claim 1, wherein the plurality of interlayer metals are configured to enhance bonding between the respective semiconductor chips and the mounting substrate.

* * * * *